(12) United States Patent
Kiyofuji et al.

(10) Patent No.: US 9,400,309 B2
(45) Date of Patent: Jul. 26, 2016

(54) ELECTRIC CONNECTING APPARATUS

(71) Applicant: Kabushiki Kaisha Nihon Micronics, Tokyo (JP)

(72) Inventors: Hidehiro Kiyofuji, Saitama (JP); Tatsuo Inoue, Tokyo (JP); Osamu Arai, Tochigi (JP); Kenji Sasaki, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 178 days.

(21) Appl. No.: 14/302,022

(22) Filed: Jun. 11, 2014

(65) Prior Publication Data

US 2015/0008945 A1    Jan. 8, 2015

(30) Foreign Application Priority Data

Jul. 8, 2013  (JP) ................. 2013-142391

(51) Int. Cl.
*G01R 31/00* (2006.01)
*G01R 31/28* (2006.01)
*G01R 1/073* (2006.01)

(52) U.S. Cl.
CPC ........ *G01R 31/2891* (2013.01); *G01R 1/07307* (2013.01); *G01R 31/2887* (2013.01)

(58) Field of Classification Search
CPC ............. G01R 31/42; G01R 31/31718; G01R 31/2865; H01J 37/32577
USPC ................. 324/750.01–750.07, 500
See application file for complete search history.

(56) References Cited

U.S. PATENT DOCUMENTS

| | | | |
|---|---|---|---|
| 5,012,858 A * | 5/1991 | Natori et al. ............ | 165/80.4 |
| 8,149,008 B2 * | 4/2012 | Yamada et al. .......... | 324/754.01 |
| 2007/0024299 A1 * | 2/2007 | Itakura et al. ........... | 324/754 |
| 2008/0297184 A1 * | 12/2008 | Miura et al. ............ | 324/754 |
| 2012/0112777 A1 * | 5/2012 | Aizawa et al. .......... | 324/750.08 |

FOREIGN PATENT DOCUMENTS

| | | |
|---|---|---|
| JP | 2010-151740 | 7/2010 |
| JP | 2010-243352 | 10/2010 |
| JP | 2011-089891 | 5/2011 |

* cited by examiner

*Primary Examiner* — Melissa Koval
*Assistant Examiner* — Trung Nguyen
(74) *Attorney, Agent, or Firm* — Ingrassia Fisher & Lorenz, P.C.

(57) ABSTRACT

An apparatus includes a probe card having a probe board with a conductive path electrically connected to a tester and probes enabling to respectively contact connection pads of a semiconductor wafer on a chuck top and moving relatively to the chuck top, and an elastic heat conducting member arranged between a working surface of the chuck top or the semiconductor wafer on the working surface and the probe board. The elastic heat conducting member can abut on the working surface of the chuck top or the semiconductor wafer on the working surface and the probe board when the probes do not abut on the respective corresponding connection pads and is elastically deformable not to prevent abutment between the probes and the respective corresponding connection pads.

7 Claims, 9 Drawing Sheets

ELECTRIC CONNECTING APPARATUS

RELATED APPLICATION

This application claims the benefit of, and claims priority to, Japanese patent application number 2013-142391, filed on Jul. 8, 2013.

TECHNICAL FIELD

The subject matter relates to an electric connecting apparatus for use in an electric test of a flat-plate-like device under test such as an integrated circuit and more specifically relates to an electric connecting apparatus enabling an electric test to be started in a short period.

BACKGROUND

In general, integrated circuits formed on a semiconductor wafer undergo an electric test to determine whether or not they have predetermined electric characteristics (that is, determination of whether or not the integrated circuits are good). In such a test, all the integrated circuits on one wafer are tested at a time or in several batches with use of an electric connecting apparatus electrically connecting electrodes of the integrated circuits to electric circuits of a testing apparatus.

The electric connecting apparatus for use in such a test includes a wiring base plate having a plurality of connection portions to be electrically connected to the electric circuits of the testing apparatus, a probe board arranged on a lower side of the wiring base plate and having a plurality of internal wires electrically connected to the connection portions, and a plurality of contacts (that is, probes) attached to a lower surface of the probe board and electrically connected to the internal wires, for example, as described in Patent Literature 1.

In recent years, with use of such an electric connecting apparatus, the integrated circuits are tested under a high temperature or a low temperature. In this case, the integrated circuits are heated or cooled to a predetermined temperature by a heat source provided in a stage on which the integrated circuits are arranged. For example, in a case where the integrated circuits are heated by the heat source, the probe board having arranged thereon the contacts is also heated by receiving radiation heat from the stage and the integrated circuits. As a result, the integrated circuits and the probe board are thermally expanded.

However, since a heat expansion amount of the semiconductor wafer and a heat expansion amount of the probe board differ, relative positional relationship between the electrodes of the integrated circuits and tip ends of the contacts changes, and the contacts whose tip ends are not pressed on the electrodes of the integrated circuits inevitably exist.

The semiconductor wafer is heated by the heat source provided in the stage to cause the temperature thereof to be constant at a certain temperature after several hours, and the probe board is also heated by radiation heat to cause the temperature thereof to be constant at a certain temperature after several hours. Since measurement can be started when the temperatures are constant, and when relative positions between the electrodes of the integrated circuits and the tip ends of the contacts are stable, it takes considerable time until start of measurement.

Patent Literature 2 proposes an electric connecting apparatus in which a probe board is provided with a heat generating body, the temperature of the probe board is measured, and electric power for heating to be supplied to the heat generating body is controlled based on the measured measurement value.

CITATION LIST

Patent Literature

PTL1: Japanese National Patent Appln. Public Disclosure No. 2011-89891
PTL2: Japanese National Patent Appln. Public Disclosure No. 2010-151740

SUMMARY

However, the electric connecting apparatus described in Patent Literature 2 is provided in the probe board with the heat generating body, which causes a problem of complicating an apparatus configuration and a control method.

An electric connecting apparatus is provided which shortens time until start of measurement with a simple apparatus configuration.

In a first aspect, an electric connecting apparatus according to an embodiment is an electric connecting apparatus having a working table holding on a working surface thereof a device under test having a plurality of electrodes and heating or cooling the device under test and electrically connecting the plurality of electrodes to a tester, and includes a probe card having a probe board provided with a first surface thereof opposed to the tester and having formed therein a conductive path to be electrically connected to the tester and a plurality of probes provided on a second surface of the probe board to be connected to the conductive path so as to enable to respectively contact the plurality of electrodes of the device under test on the working table and moving relatively to the working table, and one or a plurality of elastic heat conducting member(s) arranged between the working surface of the working table or the device under test on the working surface and the probe board, wherein the elastic heat conducting member enables to abut on the working surface of the working table or the device under test on the working surface and the probe board in a state in which the plurality of probes do not abut on the plurality of respective corresponding electrodes and is elastically deformable not to prevent abutment between the plurality of probes and the plurality of respective corresponding electrodes.

Also, in a second aspect, in the electric connecting apparatus according to the embodiment, in a free state of not receiving elastic compression between the working surface of the working table or the device under test on the working surface and the probe board, the elastic heat conducting member has a longer dimension than a distance from the probe board to tip ends of the probes.

Also, in a third aspect, in the electric connecting apparatus according to the embodiment, the elastic heat conducting member is fixed at a first end thereof on the second surface of the probe board and projects at a second end thereof toward the device under test, going over the tip ends of the probe.

Also, in a fourth aspect, in the electric connecting apparatus according to the embodiment, the elastic heat conducting member is made of heat conductive silicon rubber.

Also, in a fifth aspect, in the electric connecting apparatus according to the embodiment, the elastic heat conducting members are a plurality of columnar bodies arranged to surround an arranging region of the probes of the probe board.

Also, in a sixth aspect, in the electric connecting apparatus according to the embodiment, the elastic heat conducting member is an annular member arranged to surround the arranging region of the probes of the probe board.

With the electric connecting apparatus according to the embodiment, it is possible to shorten time until start of measurement with a simple apparatus configuration.

BRIEF DESCRIPTION OF THE DRAWINGS

FIG. 4A illustrates a state of an elastic heat conducting member in a case where a chuck top is in an initial state, FIG. 4B illustrates a state in which a stage mechanism raises the chuck top, and in which a tip end of a lower portion of the elastic heat conducting member abuts on a semiconductor wafer, and FIG. 4C illustrates a state in which the stage mechanism further raises the chuck top, and in which the probes abut on the respective corresponding connection pads.

FIG. 10A illustrates first abutment while FIG. 10B illustrates second abutment.

DETAILED DESCRIPTION

Hereinafter, an electric connecting apparatus according to embodiments will be described in details with reference to the drawings.

First Embodiment

Figure 1:
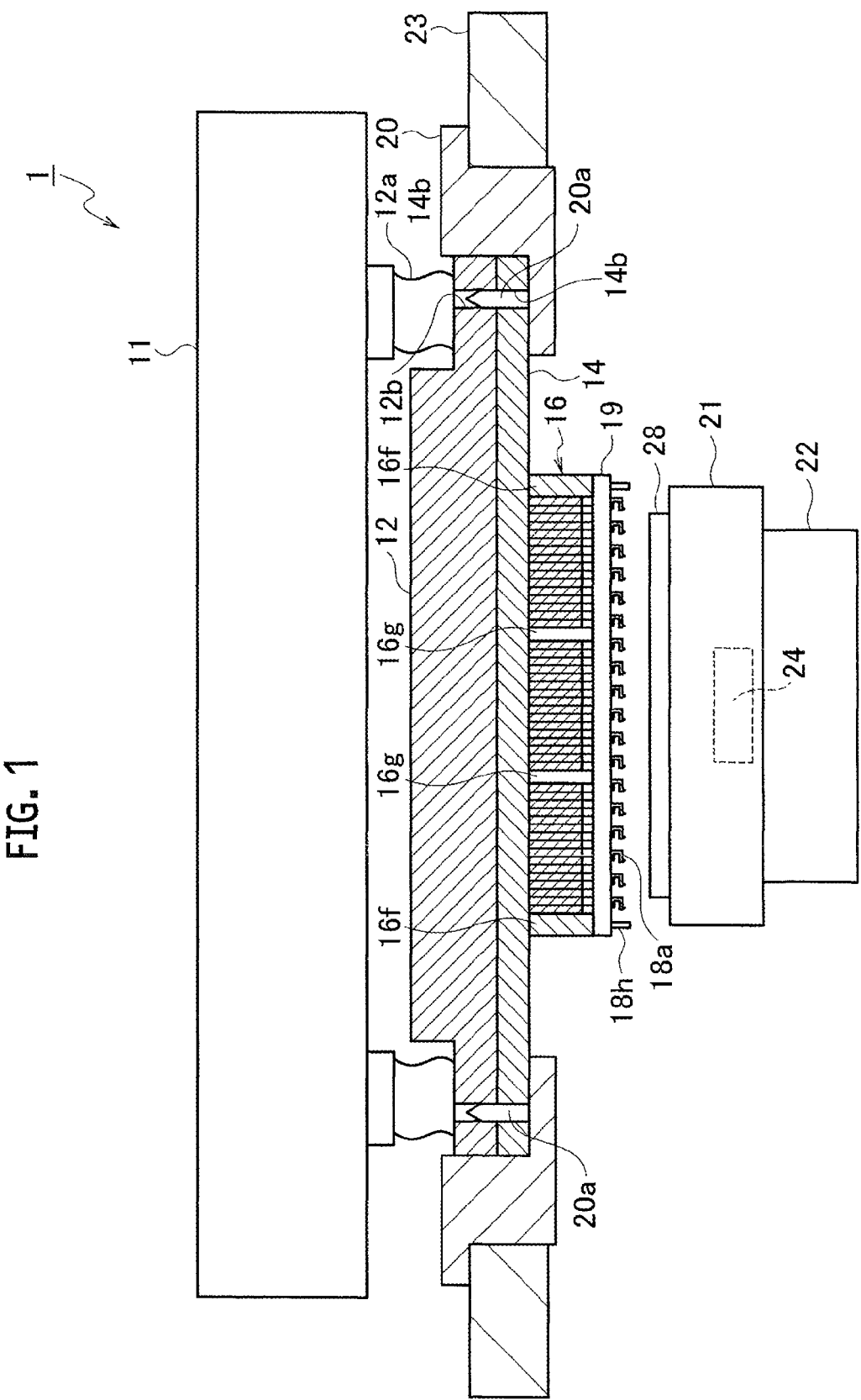
FIG. 1 illustrates an entire structure including an electric connecting apparatus according to a first embodiment.
Figure 2:
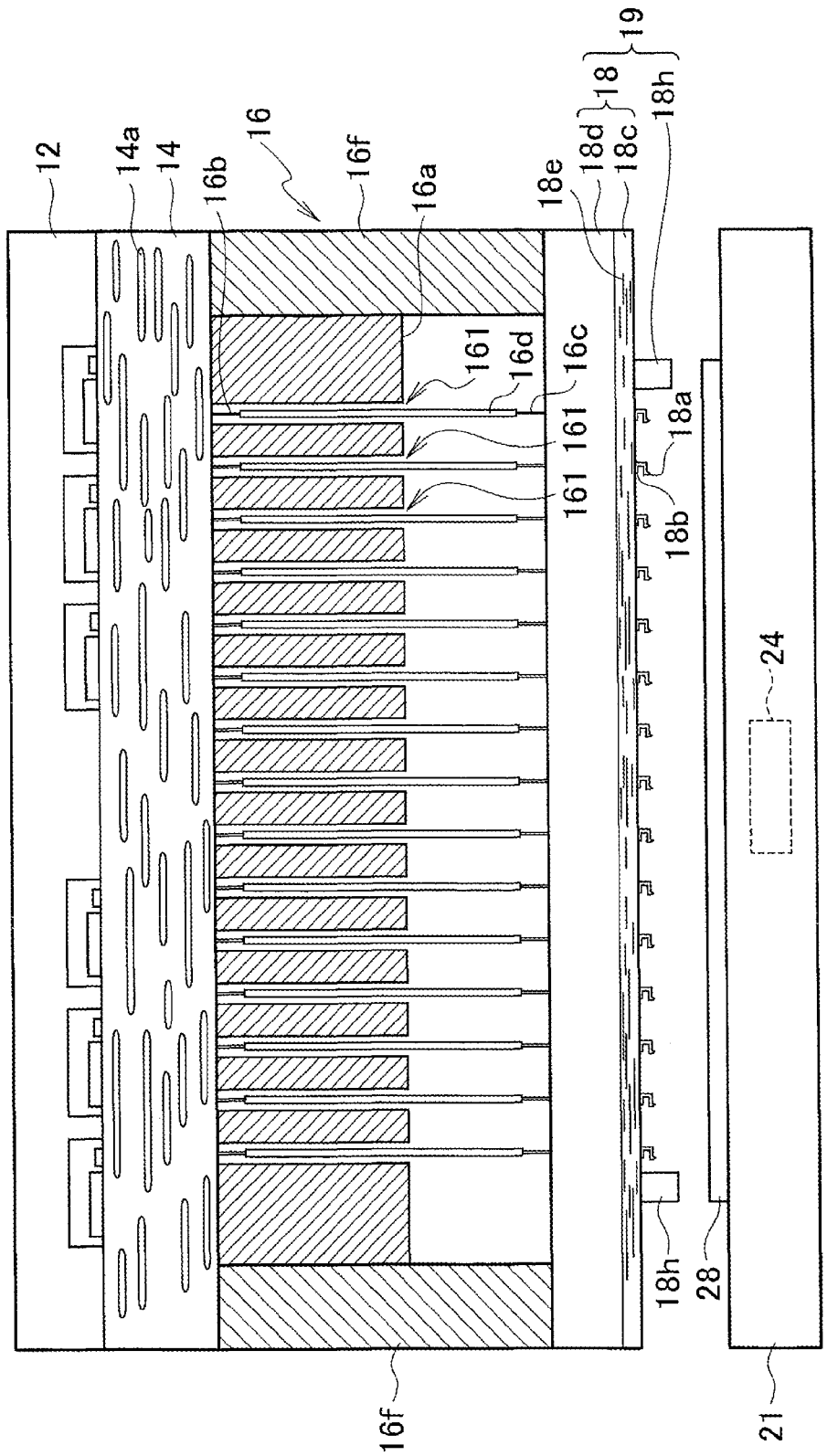
FIG. 2 schematically illustrates a structure of the electric connecting apparatus according to the first embodiment.

FIG. 1 illustrates an entire structure including an electric connecting apparatus according to a first embodiment, and FIG. 2 schematically illustrates a structure of the electric connecting apparatus according to the first embodiment.

As illustrated in FIG. 1 and FIG. 2, an electric connecting apparatus 1 according to the first embodiment includes a flat-plate-like supporting member (stiffener) 12 whose lower surface is a planar attaching reference plane, a circular flat-plate-like wiring base plate 14 held on the attaching plane of the supporting member 12, a circular flat-plate-like probe card 19 contacting a semiconductor wafer 28 as a device under test, and an electric connector 16 electrically connecting the wiring base plate 14 to the probe card 19 and is held by a holder 20.

The holder 20 is supported by a prober base 23 and has a crank-like cross-sectional structure so as to receive the electric connecting apparatus 1. The holder 20 also has supporting pins 20a adapted to support the supporting member 12 and the wiring base plate 14 of the electric connecting apparatus 1.

The supporting member 12 is provided with through holes 12b vertically penetrating the supporting member 12 while the wiring base plate 14 is provided with through holes 14b vertically penetrating the wiring base plate 14. The supporting pins 20a are fit in the through holes 12b and the through holes 14b to cause the supporting member 12 and the wiring base plate 14 to be supported by the holder 20.

The electric connecting apparatus 1 is used to connect respective connection pads (electrodes) as connection terminals of multiple chips or DUT chips (integrated circuits) formed on the semiconductor wafer 28 to electric circuits of a tester 11 for an electric test of the chips or DUT chips, for example.

Thus, the entire structure includes a chuck top 21 receiving on an upper surface thereof the semiconductor wafer 28 provided with the respective connection pads (electrodes) as the connection terminals of the chips or DUT chips to releasably vacuum-adsorb the semiconductor wafer 28 and a stage mechanism 22 vertically moving the chuck top 21. By the vertical movement of the stage mechanism 22, the chips or DUT chips on the semiconductor wafer 28 are brought into contact with the probe card 19 of the electric connecting apparatus 1 to execute an electric test by the tester 11.

Also, the chuck top 21 includes a heat source 24 heating or cooling the semiconductor wafer 28 mounted thereon. The semiconductor wafer 28 is heated or cooled by this heat source 24, and the probe card 19 is heated or cooled by radiation heat of the heat source 24.

The wiring base plate 14 is made of an entirely circular plate-like polyimide resin plate, for example, and is provided on an upper surface (first surface) thereof with connection wires 12a connected to the tester 11.

Also, a lower surface of the wiring base plate 14 is provided with land portions (not illustrated) to be electrically connected to the connection wires 12a via wiring paths 14 formed in the wiring base plate 14.

The supporting member 12 includes a plate-like frame member made of a stainless steel plate, for example, arranged with the attaching plane thereof abutting on the upper surface of the wiring base plate 14.

The probe card 19 includes a probe board 18 and probes 18a.

The probe board 18 includes a supporting member 18d made of a ceramic plate, for example, and a multilayered wiring layer 18c formed on a lower surface of the supporting member 18d or the ceramic plate. The multilayered wiring layer 18c has a multilayered plate made of a polyimide resin material, for example, exhibiting electric insulating characteristics, and wiring paths 18e formed among respective layers of the multilayered plate.

A lower surface (second surface) of the multilayered wiring layer 18c is provided with probe lands 18b respectively electrically connected to the wiring paths 18e of the multilayered wiring layer 18c.

Each probe 18a is connected at an upper end thereof to the corresponding probe land 18b of the probe board 18, is thus attached to the probe board 18 so as to project downward from the lower surface of the multilayered wiring layer 18c, and is connected to the wiring path 18e of the multilayered wiring layer 18c.

The lower surface (second surface) of the multilayered wiring layer 18c is further provided with elastic heat conducting members 18h having elasticity as silicon rubber with low hardness, formed in columnar shapes by a heat conducting material, and arranged to surround an arranging region of the probes 18a of the probe board 18, for example.

Figure 3:
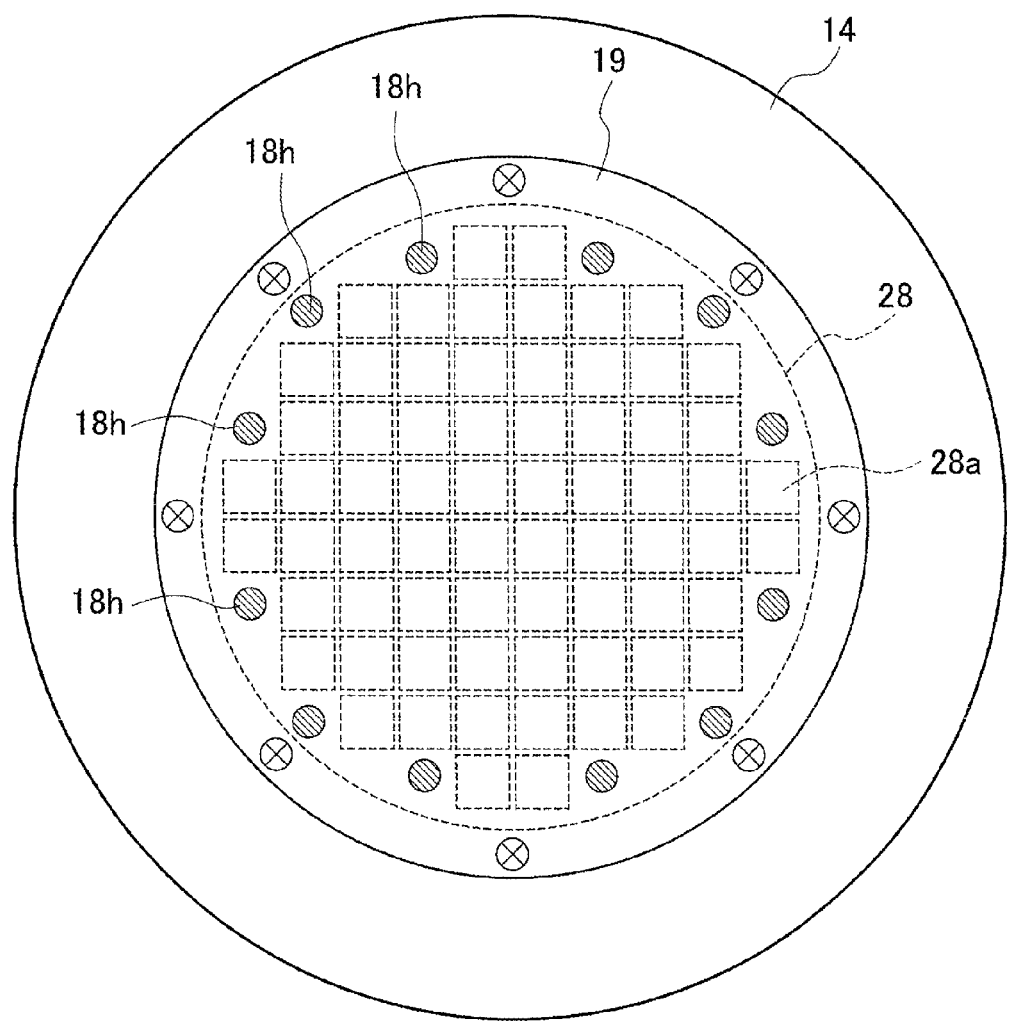
FIG. 3 is a view of a probe board included in the electric connecting apparatus according to the first embodiment seen from a lower side.

FIG. 3 is a view of the probe board 18 included in the electric connecting apparatus 1 according to the first embodiment seen from a lower side. Note that, in FIG. 3, a position of the semiconductor wafer 28 and positions of the connection pads 28a of the multiple chips or DUT chips formed on the semiconductor wafer 28 are illustrated by dashed lines.

As illustrated in FIG. 3, the lower surface of the probe board 18 is provided with the twelve elastic heat conducting members 18h formed in columnar shapes, and these elastic heat conducting members 18h are arranged not to contact the connection pads 28a of the multiple chips or DUT chips formed on the semiconductor wafer 28.

The elastic heat conducting members 18h are provided to enable to abut on regions of the semiconductor wafer 28 except regions provided with the connection pads 28a and the lower surface of the probe board 18 in a state in which the probes 18a do not abut on the respective corresponding connection pads 28a and to be elastically deformable not to prevent abutment between the probes 18a and the respective corresponding connection pads 28a.

Figure 4A:
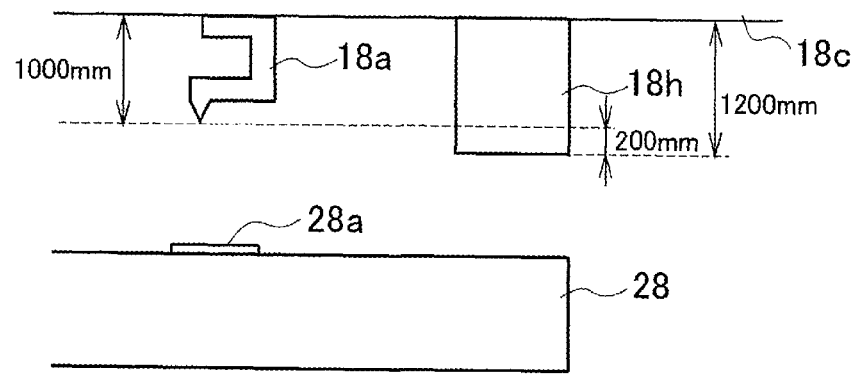
FIGS. 4A to 4C are side views describing abutment between probes included in the electric connecting apparatus according to the first embodiment and respective corresponding connection pads.
Figure 4B:
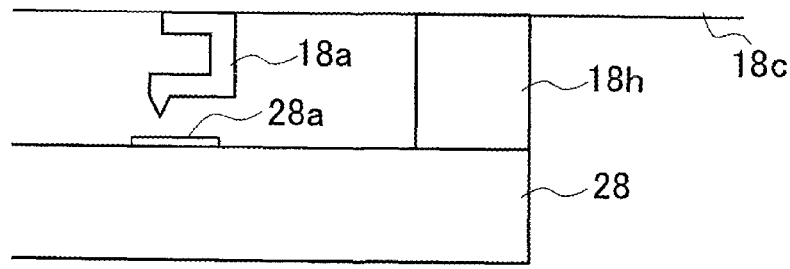
Figure 4C:
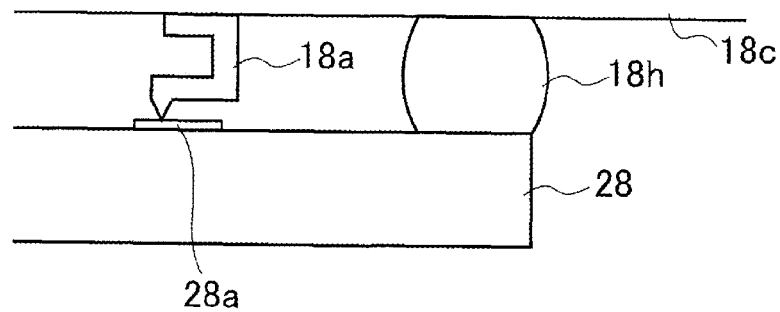

FIGS. 4A to 4C are side views describing abutment between the probes 18a included in the electric connecting apparatus 1 according to the first embodiment and the respective corresponding connection pads 28a. FIG. 4A illustrates a state of the elastic heat conducting member 18h in a case where the chuck top 21 is in an initial state, FIG. 4B illustrates a state in which the stage mechanism 22 raises the chuck top 21, and in which a tip end of a lower portion of the elastic heat conducting member 18h abuts on the semiconductor wafer 28, and FIG. 4C illustrates a state in which the stage mechanism 22 further raises the chuck top 21, and in which the probes 18a abut on the respective corresponding connection pads 28a.

As illustrated in FIG. 4A, in a state in which the chuck top 21 is in an initial state, that is, a free state in which the elastic heat conducting member 18h does not receive elastic compression between the semiconductor wafer 28 on the chuck top 21 and the probe board 18, the elastic heat conducting member 18h has an entire length of 1200 (mm), which is a longer dimension than a distance (1000 mm) from the probe board 18 to tip ends of the probes 18a.

Subsequently, as illustrated in FIG. 4B, when the stage mechanism 22 raises the chuck top 21, the tip end of the lower portion of the elastic heat conducting member 18h abuts on the semiconductor wafer 28. When the tip end of the lower portion of the elastic heat conducting member 18h abuts on the semiconductor wafer 28 in this manner, heat of the heat source 24 provided in the chuck top 21 is transferred to the semiconductor wafer 28 and the probe board 18. By doing so, time until the probe board 18 reaches heat equilibrium can be shortened further than in a case of raising the temperature of the probe board 18 only by radiation heat, and time until start of measurement can be shortened.

Subsequently, when the probe board 18 reaches heat equilibrium, the stage mechanism 22 further raises the chuck top 21 and causes the probes 18a to abut on the respective corresponding connection pads 28a. At this time, the elastic heat conducting member 18h is elastically deformed not to prevent abutment between the probes 18a and the respective corresponding connection pads 28a. By doing so, the respective connection pads 28a of the semiconductor wafer 28 and the tester 11 are electrically connected, and an electric test is executed.

Returning to FIG. 2, an upper surface (first surface) of the supporting member 18d of the probe board 18 is provided with land portions (not illustrated) at positions respectively corresponding to the land portions provided on the lower surface (second surface) of the wiring base plate 14. The land portions provided on the probe board 18 are respectively electrically connected via the wiring paths 18e of the multilayered wiring layer 18c to the respective probes 18a.

Between the probe board 18 and the wiring base plate 14 is arranged the electric connector 16 for electric connection.

In the electric connector 16 is arranged to contact the wiring base plate 14 a pogo pin block 16a made of an electric insulating plate-like member having formed therein multiple through holes 16l formed in a plate thickness direction as enlarged and illustrated in FIG. 2.

Also, in each through hole 16l of the pogo pin block 16a is arranged a pair of pogo pins 16b and 16c housed to be slidable in an axial direction of the through hole 16l in a state of being prevented from falling from the through hole 16l. Between the pogo pins 16b and 16c as each pair is arranged a compression coil spring 16d applying a biasing force to both the pogo pins 16b and 16c in a direction away from each other and functioning as a conductive path between the pogo pins.

The pogo pins 16b are provided at positions respectively corresponding to the land portions provided on the lower surface (second surface) of the wiring base plate 14 while the pogo pins 16c are provided at positions respectively corresponding to the land portions provided on the upper surface (first surface) of the probe board 18.

In an assembled state of the electric connector 16, by spring forces of the compression coil springs 16d, the pogo pins 16b provided on a side of the wiring base plate 14 are brought into pressure contact with the land portions provided on the lower surface (second surface) of the wiring base plate 14, and the pogo pins 16c provided on a side of the probe board 18 are brought into pressure contact with the land portions provided on the upper surface (first surface) of the probe board 18.

By doing so, the probes 18a are electrically connected to the corresponding land portions of the wiring base plate 14. As a result, when the tip ends of the probes 18a abut on the connection pads 28a of the chips or DUT chips formed on the semiconductor wafer 28, the connection pads 28a are connected via the corresponding respective probes 18a, the electric connector 16, and the wiring base plate 14 to the tester 11. Accordingly, an electric test of the integrated circuits on the semiconductor wafer 28 can be performed by the tester 11.

Also, as illustrated in FIG. 1, the electric connector 16 is provided at an outer circumferential portion thereof with a low heat conduction supporting member 16f arranged with both ends thereof abutting on the wiring base plate 14 and the probe board 18 and inside with low heat conduction supporting members 16g arranged each with both ends thereof abutting on the wiring base plate 14 and the probe board 18.

These low heat conduction supporting members 16f and 16g are made of a heat insulating member having lower heat conductivity than that of the pogo pin block 16a such as formed plastic, wood, and an epoxy resin.

Figure 5:
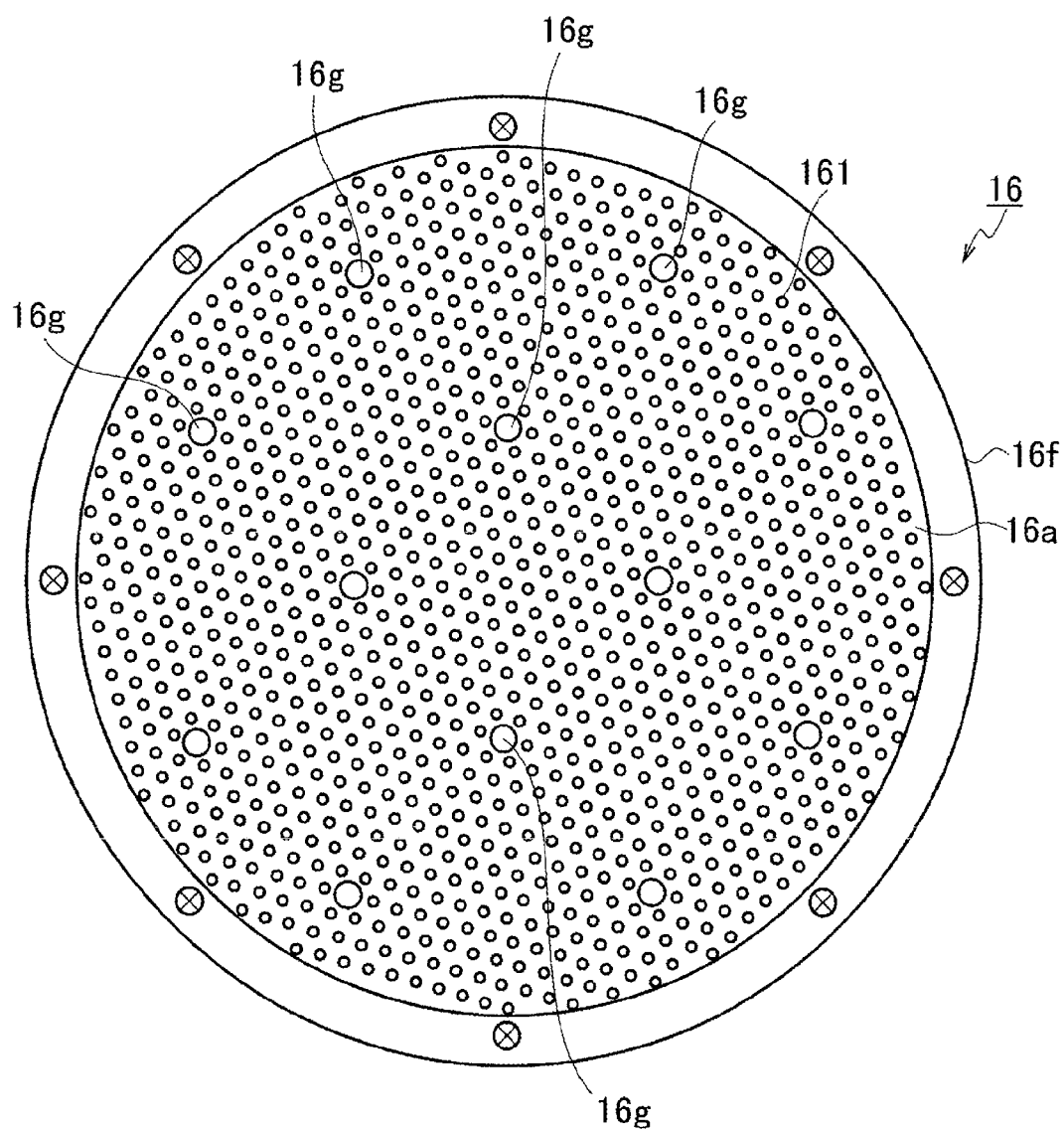
FIG. 5 is a plan view illustrating an electric connector included in the electric connecting apparatus according to the first embodiment.

FIG. 5 is a plan view illustrating the electric connector 16 included in the electric connecting apparatus 1 according to the first embodiment.

As illustrated in FIG. 5, the electric connector 16 includes the pogo pin block 16a provided with the through holes 16l, the annular low heat conduction supporting member 16f at the outer circumferential portion of the pogo pin block 16a, and the low heat conduction supporting members 16g formed in columnar shapes so as to penetrate the pogo pin block 16a.

In this manner, the low heat conduction supporting members 16f and 16g are arranged at the outer circumferential portion of and inside the pogo pin block 16a with both the ends abutting on the lower surface of the wiring base plate 14 and the upper surface of the probe board 18. By doing so, heat conduction between the wiring base plate 14 and the probe board 18 can be decreased, and heat conduction destinations from the heat source 24 provided in the chuck top 21 are mainly the semiconductor wafer 28 and the probe board 18. Thus, since heat capacity of the heat conduction destination (probe board 18) by radiation heat and heat conduction by the elastic heat conducting members 18h can be small, time until the probe board 18 reaches heat equilibrium can be shortened, and time until start of measurement can be shortened.

About Heat Equilibrium

Here, heat equilibrium of the probe board 18 will be described in details.

As described above, the chuck top 21 includes the heat source 24 heating or cooling the semiconductor wafer 28 mounted thereon. The semiconductor wafer 28 is heated or cooled by this heat source 24 while the probe board 18 is heated or cooled by radiation heat of the heat source 24 and heat conduction by the elastic heat conducting members 18h, and the semiconductor wafer 28 and the probe board 18 reach heat equilibrium.

For example, in a case of heating by the heat source 24, when the temperature of the heat source 24 in the chuck top 21 is 125 (° C.), the temperature of a lower surface of the semiconductor wafer 28 is approximately 122 (° C.) while the lower surface of the probe board 18 is approximately 90 (° C.) by radiation heat, and the semiconductor wafer 28 and the probe board 18 are in heat equilibrium states at these temperatures.

When the semiconductor wafer 28 and the probe board 18 are heated in this manner, the semiconductor wafer 28 and the probe board 18 are thermally expanded. Along with the heat expansion, positions of the connection pads 28a of the chips or DUT chips formed on the semiconductor wafer 28 and positions of the probes 18a attached to the lower surface of the probe board 18 move. Thus, the positions of the probes 18a need to be determined so that the tip ends of the probes 18a may abut on the connection pads 28a of the chips or DUT chips formed on the semiconductor wafer 28 when the semiconductor wafer 28 and the probe board 18 reach heat equilibrium.

Figure 6:
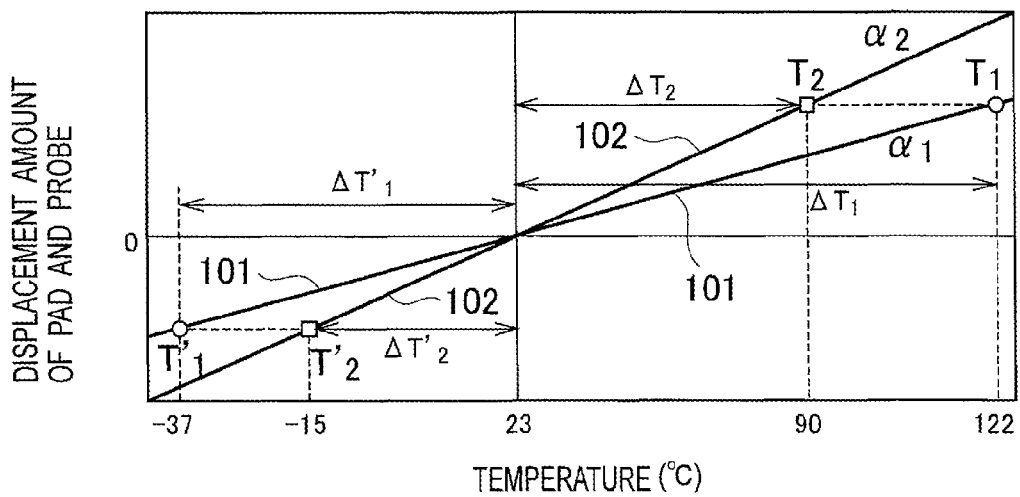
FIG. 6 illustrates changes of a position of the probe provided at a certain point away from a center of the disk-shaped probe board included in the electric connecting apparatus according to the first embodiment and a position of the connection pad of an chip or DUT chip arranged at a certain point away from a center of the disk-shaped semiconductor wafer.

FIG. 6 illustrates changes of a position of the probe 18a provided at a certain point away from a center of the disk-shaped probe board 18 included in the electric connecting apparatus 1 according to the first embodiment and a position of the connection pad 28a of the chip or DUT chip arranged at a certain point away from a center of the disk-shaped semiconductor wafer 28. A straight line 101 illustrated in FIG. 6 represents positional changes of the connection pad 28a of the chip or DUT chip formed on the semiconductor wafer 28 in accordance with temperature changes while a straight line 102 represents positional changes of the probe 18a in accordance with temperature changes. Here, each of the positional changes (displacement amount) means a moving distance in a direction toward an outer circumference with a position at a normal temperature (regarded as 23° C.) set as a reference.

An inclination of the straight line 101 is determined by a heat expansion coefficient α1 of the semiconductor wafer 28 while an inclination of the straight line 102 is determined by a heat expansion coefficient α2 of the probe board 18. Thus, the position of the probe 18a needs to be determined in advance so that the positions of the probe 18a and the connection pad 28a, determined from the respective heat expansion coefficients α1 and α2 at respective temperatures T1 and T2 at which heat equilibrium is reached, may be equal.

More specifically, the position of the probe 18a is determined so that the position of the connection pad 28a when the temperature T1 of the lower surface of the semiconductor wafer 28 reaching heat equilibrium is 122 (° C.) and the position of the probe 18a when the temperature T2 of the lower surface of the probe board 18 reaching heat equilibrium is 90 (° C.) may correspond.

For example, when a displacement amount, in the direction toward the outer circumference, of the connection pad 28a arranged at a position 150 (mm) away from the center of the disk shape of the semiconductor wafer 28 in the direction toward the outer circumference at the normal temperature (regarded as 23° C.) is ΔL1 (mm), ΔL1 (mm) is expressed as the following (Equation 1).

$$\Delta L1 = 150 \cdot \alpha 1 \cdot \Delta T1 \quad \text{(Equation 1)}$$

In this equation, α1 is a heat expansion coefficient of the semiconductor wafer 28, and ΔT1 is a difference between the normal temperature and a high-temperature-side temperature of the semiconductor wafer 28 at the time of heat equilibrium.

Also, when a displacement amount, in the direction toward the outer circumference, of the probe 18a arranged at a position 150 (mm) away from the center of the disk shape of the probe board 18 in the direction toward the outer circumference at the normal temperature (regarded as 23° C.) is ΔL2 (mm), ΔL2 (mm) is expressed as the following (Equation 2).

$$\Delta L2 = 150 \cdot \alpha 2 \cdot \Delta T2 \quad \text{(Equation 2)}$$

In this equation, α2 is a heat expansion coefficient of the probe board 18, and ΔT2 is a difference between the normal temperature and a high-temperature-side temperature of the probe board 18 at the time of heat equilibrium.

Here, to make the position of the connection pad 28a and the position of the probe 18a at the time of heat equilibrium correspond, the position of the probe 18a needs to be determined in advance so that relationship of the following (Equation 3) may be established.

$$\alpha 1 \cdot \Delta T1 = \alpha 2 \cdot \Delta T2 \quad \text{(Equation 3)}$$

Meanwhile, calculation has only to be carried out, setting the heat expansion coefficient α1 as 3.5 (ppm/° C.) in a case where the semiconductor wafer 28 is silicon, and setting the heat expansion coefficient α2 as 5.5 (ppm/° C.) in a case where the probe board 18 consists mainly of ceramic.

Also, in a case of cooling the semiconductor wafer 28 and the probe board 18, as well as heating them, the following (Equation 4) is similarly established.

$$\alpha 1 \cdot \Delta T'1 = \alpha 2 \cdot \Delta T'2 \quad \text{(Equation 4)}$$

In this equation, ΔT'1 is a difference between the normal temperature and a low-temperature-side temperature of the semiconductor wafer 28 at the time of heat equilibrium. ΔT'2 is a difference between the normal temperature and a low-temperature-side temperature of the probe board 18 at the time of heat equilibrium. For example, the position of the probe 18a may be determined so that the position of the connection pad 28a when the temperature T'1 of the lower surface of the semiconductor wafer 28 reaching heat equilibrium is −37 (° C.) (ΔT'1=60° C.) and the position of the probe 18a when the temperature T'2 of the lower surface of the probe board 18 reaching heat equilibrium is −15 (° C.) (ΔT'2=38° C.) may correspond.

In this manner, the positions of the probes 18a are determined, and the probes 18a are arranged at the determined positions, to manufacture the probe board 18. Accordingly, the electric connecting apparatus 1 according to the first embodiment can perform an electric test of the semiconductor wafer 28 at the temperature expressed in the (Equation 3) or the (Equation 4).

Effects of First Embodiment

Next, effects of the electric connecting apparatus 1 according to the first embodiment will be described.

Figure 7:
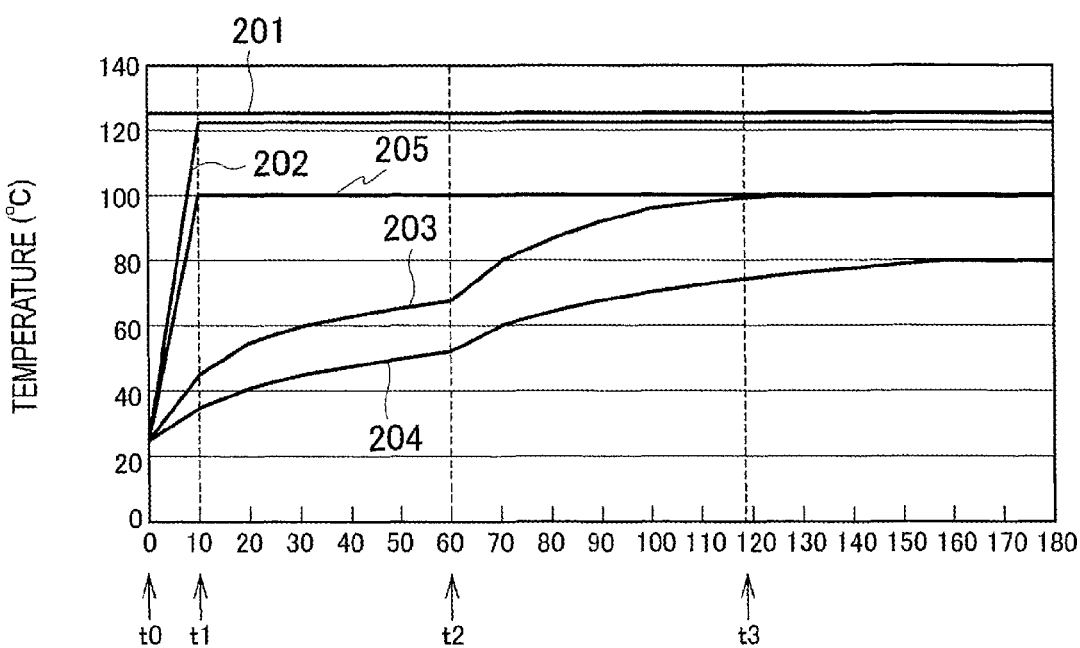
FIG. 7 illustrates temperature changes until start of measurement in a case where heating by a heat source in the chuck top is started.

FIG. 7 illustrates temperature changes until start of measurement in a case where heating by the heat source 24 in the chuck top 21 is started at a time point t0. In FIG. 7, a temperature 201 is a temperature of the heat source 24 in the chuck top 21 of the electric connecting apparatus 1 according to the first embodiment, and a temperature 202 is a temperature of the lower surface of the semiconductor wafer 28 of the electric connecting apparatus 1 according to the first embodiment. For comparison, a temperature 203 is a temperature of a lower surface of a probe board according to a conventional technique, and a temperature 204 is a temperature of an upper surface of a wiring base plate according to the conventional technique. A temperature 205 is a temperature of the lower surface of the probe board 18 of the electric connecting apparatus 1 according to the first embodiment.

In the conventional technique, when heating by the heat source 24 in the chuck top 21 is started at the time point t0, the respective temperatures 203 and 204 moderately rise until a time point t2. At this time, temperature rise ratios of the temperatures 203 and 204 decrease as time approaches the time point t2.

Subsequently, at the time point t2, the stage mechanism 22 moves upward, and thus the chips or DUT chips on the semiconductor wafer 28 and the probe board of the electric connecting apparatus 1 contact, which causes heat conduction from the semiconductor wafer 28 to the probe board. Thus, at a time point t3, at which approximately 120 (minutes) have passed since the time point t0, an electric test of the semiconductor wafer 28 can be performed finally.

In this manner, in the conventional technique, since 120 (minutes) are required until the probe board reaches heat equilibrium from start of heating, it takes considerable time until start of measurement.

On the other hand, in the electric connecting apparatus 1 according to the first embodiment, when heating by the heat source 24 in the chuck top 21 is started at the time point t0, the temperature 205 of the lower surface of the probe board 18 reaches a heat equilibrium state at a time point t1, at which approximately 10 (minutes) have passed since the time point t0, and thus an electric test of the semiconductor wafer 28 can be performed.

In this manner, since the electric connecting apparatus 1 according to the first embodiment is provided with the low heat conduction supporting member 16f arranged with both ends thereof abutting on the wiring base plate 14 and the probe board 18, heat conduction from the probe board 18 to the wiring base plate 14 can be decreased. Accordingly, since heat capacity of the probe board 18 can be small, and time until the probe board 18 reaches heat equilibrium can be as short as approximately 10 (minutes), and time until start of measurement can be shortened.

Also, since the electric connecting apparatus 1 according to the first embodiment is provided with the elastic heat conducting members 18h provided to enable to abut on a working surface of the chuck top 21 and the probe board 18 in a state in which the probes 18a do not abut on the respective corresponding connection pads (electrodes) and to enable elastic deformation not to prevent abutment between the probes 18a and the respective corresponding connection pads 28a, heat of the heat source 24 provided in the chuck top 21 is transferred to the semiconductor wafer 28 and the probe board 18. Accordingly, time until the probe board 18 reaches heat equilibrium can be further shortened, and time until start of measurement can be further shortened.

Also, in the electric connecting apparatus 1 according to the first embodiment, since no heat source needs to be provided in the probe board 18, time until start of measurement can be drastically shortened without complicating an apparatus configuration and a control method.

Meanwhile, although the first embodiment has been described taking as an example the electric connecting apparatus 1 including the low heat conduction supporting member 16f and the elastic heat conducting members 18h, the subject manner is not limited to this, and a configuration including either the low heat conduction supporting member 16f or the elastic heat conducting members 18h is also available.

Also, although the first embodiment has been described taking as an example the electric connecting apparatus 1 including the pogo pin block 16a arranged to contact the wiring base plate 14, the subject manner is not limited to this, and the pogo pin block 16a may be arranged to contact the probe board 18. In other words, the pogo pin block 16a has only to be arranged to contact either the wiring base plate 14 or the probe board 18.

Also, although the first embodiment has been described taking as an example the electric connecting apparatus 1 including the probe board 18 consisting mainly of ceramic, the subject manner is not limited to this, and the probe board 18 may be made of a material whose heat expansion coefficient is close to that of silicon, which is a main material of the semiconductor wafer 28. By doing so, heat expansion of the probe board 18 can follow that of the semiconductor wafer 28.

Further, although the first embodiment has a configuration including the elastic heat conducting members 18h provided to enable to abut on the regions of the semiconductor wafer 28 except the regions provided with the connection pads 28a and the lower surface of the probe board 18 in a state in which the probes 18a do not abut on the respective corresponding connection pads 28a and to enable elastic deformation not to prevent abutment between the probes 18a and the respective corresponding connection pads 28a, the subject manner is not limited to this.

For example, the elastic heat conducting members 18h may be provided to enable to abut on a working surface of the chuck top 21 and the lower surface of the probe board 18 in a state in which the probes 18a do not abut on the respective corresponding connection pads 28a and to enable elastic deformation not to prevent abutment between the probes 18a and the respective corresponding connection pads 28a.

Still further, in the first embodiment, a thermometer measuring a temperature of the probe board 18 may be provided, and the stage mechanism 22 may be configured to raise and lower the chuck top 21 in accordance with the measured temperature by the thermometer.

More specifically, the first embodiment may include a thermometer measuring a temperature of the probe board 18 and a control unit moving the probe card 19 in a direction of the chuck top 21 so that the probes 18a and the respective corresponding connection pads 28a may abut on each other in a case where temporal changes of the temperature measured by the thermometer are within a predetermined temperature range when the probes 18a are in a non-abutting state on the respective corresponding connection pads 28a and when the elastic heat conducting members 18h are in an abutting state on the working surface of the chuck top 21 or the semiconductor wafer 28 on the working surface and the probe board 18. Here, the predetermined temperature range is set in advance as 85 (° C.) to 95 (° C.), for example, as a temperature range in which the temperature of the probe board 18 is stable.

Still further, although the first embodiment has been described taking as an example the electric connecting apparatus 1 including the elastic heat conducting members 18h having elasticity as silicon rubber with low hardness, formed in columnar shapes by a heat conducting material, and arranged on the lower surface of the multilayered wiring layer 18c to surround the arranging region of the probes 18a of the probe board 18, the subject manner is not limited to this, and the elastic heat conducting member 18h may be formed in an annular shape to surround the arranging region of the probes 18a of the probe board 18 and may be arranged on the lower surface of the multilayered wiring layer 18c.

Second Embodiment

A second embodiment will be described taking as an example the electric connecting apparatus 1 including the probe board 18 whose heat capacity is further reduced.

Figure 8:
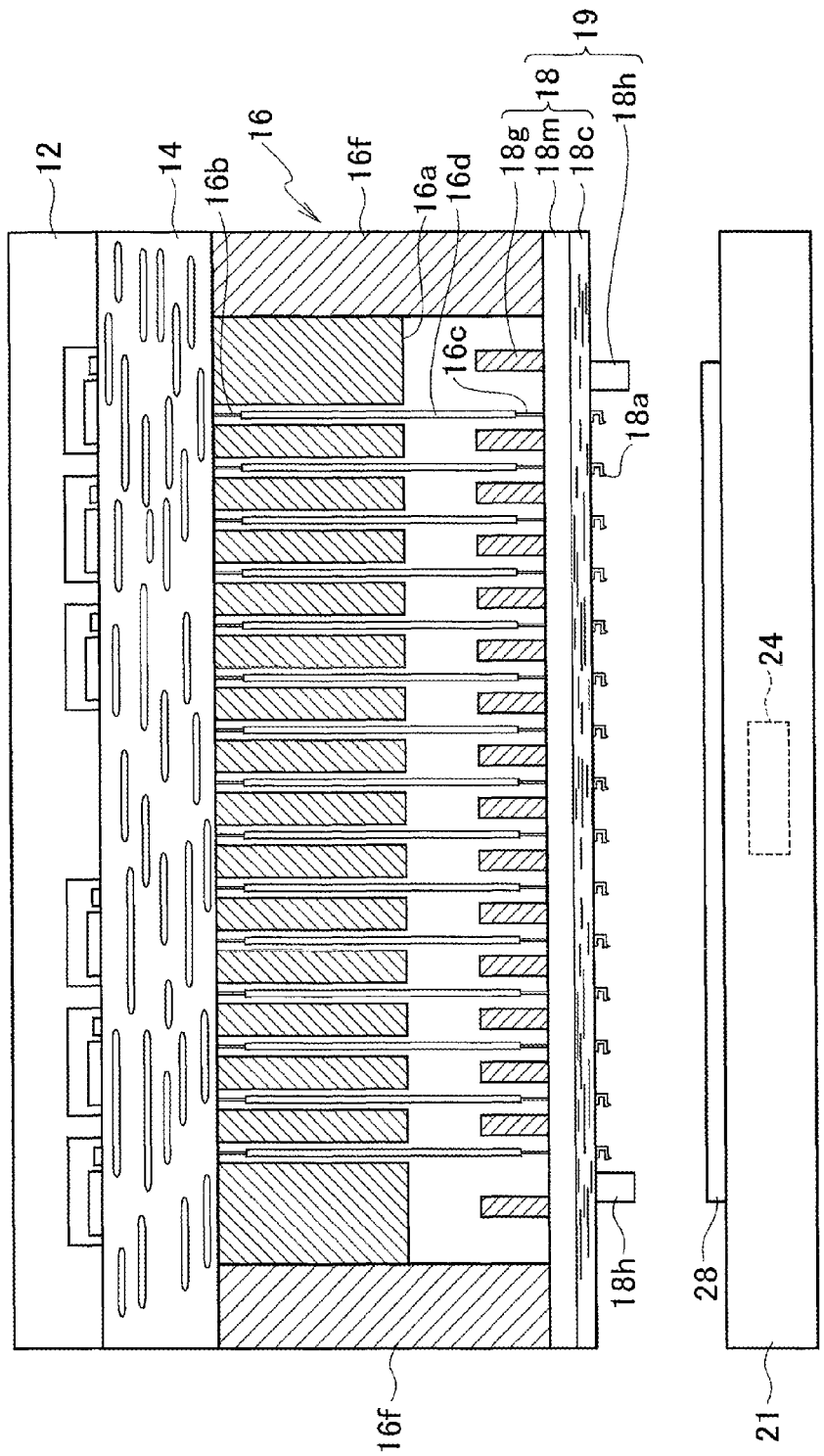
FIG. 8 schematically illustrates a structure of the electric connecting apparatus according to a second embodiment.

FIG. 8 schematically illustrates a structure of the electric connecting apparatus 1 according to the second embodiment. It is to be noted that, among components included in the electric connecting apparatus 1 according to the second embodiment, components with the same reference numerals as those in the electric connecting apparatus 1 according to the first embodiment are equal, and thus description of the duplicate components is omitted.

As illustrated in FIG. 8, the probe board 18 includes a supporting member 18m made of a ceramic plate, for example, the multilayered wiring layer 18c formed on a lower surface of the supporting member 18m, and a fixing member 18g formed on an upper surface of the supporting member 18m.

The supporting member 18m is formed to have a shorter plate thickness than that of the supporting member 18d included in the electric connecting apparatus 1 according to the first embodiment. By doing so, since heat capacity of the probe board 18 can be small, and time until the probe board 18 reaches heat equilibrium can be shortened, time until start of measurement can be drastically shortened.

Also, to keep strength, the fixing member 18g is provided on the upper surface of the supporting member 18m. This fixing member 18g is formed with use of ceramic or the like having a heat expansion coefficient of 4 (ppm/° C.) or less to have a beam structure, for example. By doing so, heat capacity of the probe board 18 can be reduced without causing the probe board 18 to contact the pogo pin block 16a and the pogo pins 16c, and the probe board 18 can keep sufficient strength to prevent the probe card 19 from being deformed by heat.

Third Embodiment

The first embodiment has been described taking as an example the electric connecting apparatus 1 including on the lower surface of the multilayered wiring layer 18c of the probe board 18 the elastic heat conducting members 18h having elasticity and formed in columnar shapes by a heat conducting material.

A third embodiment will be described taking as an example the electric connecting apparatus 1 including on the working surface of the chuck top 21 elastic heat conducting members 21a having elasticity and formed in columnar shapes by a heat conducting material, instead of the elastic heat conducting members 18h.

Figure 9:
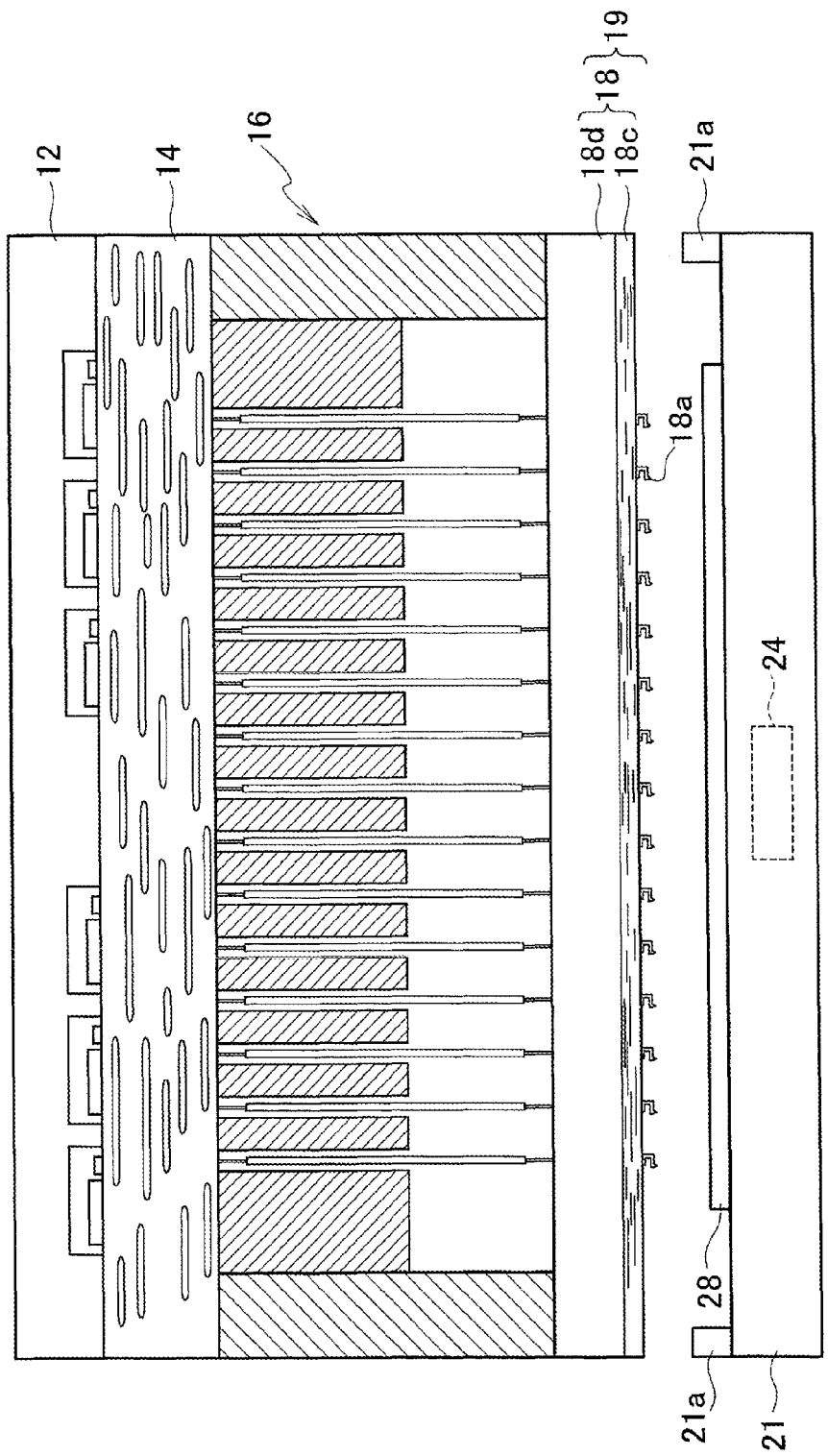
FIG. 9 schematically illustrates a structure of the electric connecting apparatus according to a third embodiment.

FIG. 9 schematically illustrates a structure of the electric connecting apparatus 1 according to the third embodiment. It is to be noted that, among components included in the electric connecting apparatus 1 according to the third embodiment, components with the same reference numerals as those in the electric connecting apparatus 1 according to the first embodiment are equal, and thus description of the duplicate components is omitted.

As illustrated in FIG. 9, on the working surface of the chuck top 21 are provided the plurality of elastic heat conducting members 21a having elasticity as silicon rubber with low hardness and formed in columnar shapes by a heat conducting material.

The elastic heat conducting members 21a are provided to enable to abut on the working surface of the chuck top 21 and the lower surface of the probe board 18 in a state in which the probes 18a do not abut on the respective corresponding connection pads 28a and to be elastically deformable not to prevent abutment between the probes 18a and the respective corresponding connection pads 28a.

By doing so, heat of the heat source 24 provided in the chuck top 21 is transferred to the semiconductor wafer 28 and the probe board 18. Accordingly, time until the probe board 18 reaches heat equilibrium can be shortened, and time until start of measurement can be further shortened.

Fourth Embodiment

The first embodiment has been described taking as an example the electric connecting apparatus 1 in which the elastic heat conducting members 18h are arranged outside the connection pads 28a on the lower surface of the multilayered wiring layer 18c of the probe board 18 so as not to contact the connection pads 28a.

A fourth embodiment will be described taking as an example the electric connecting apparatus 1 in which the elastic heat conducting members 18h are arranged outside and inside the connection pads 28a.

Figure 10A:
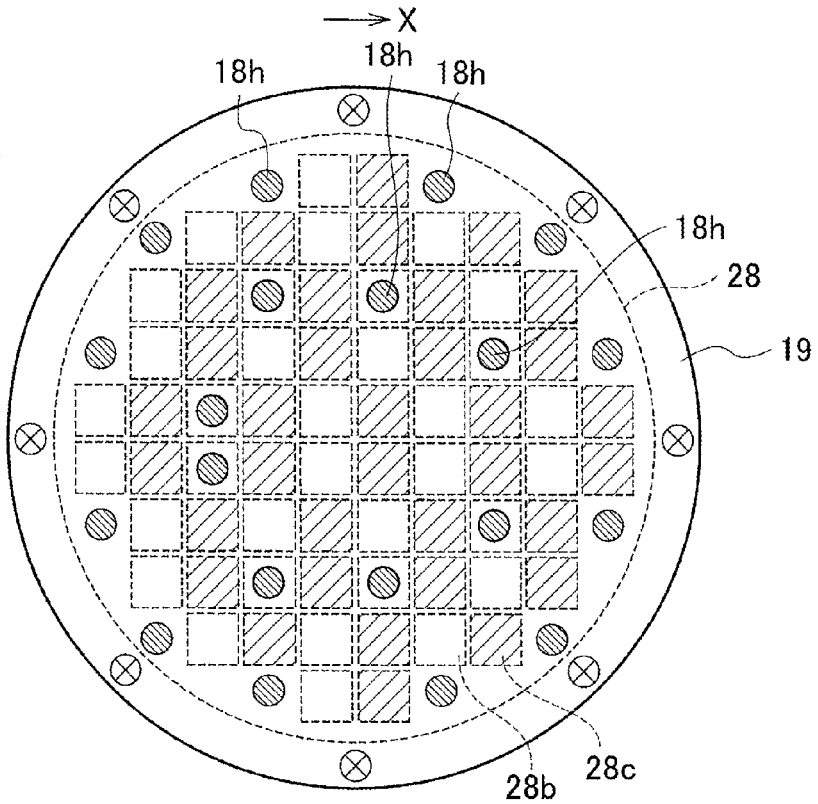
FIGS. 10A and 10B are views of the probe board included in the electric connecting apparatus according to a fourth embodiment seen from a lower side.
Figure 10B:
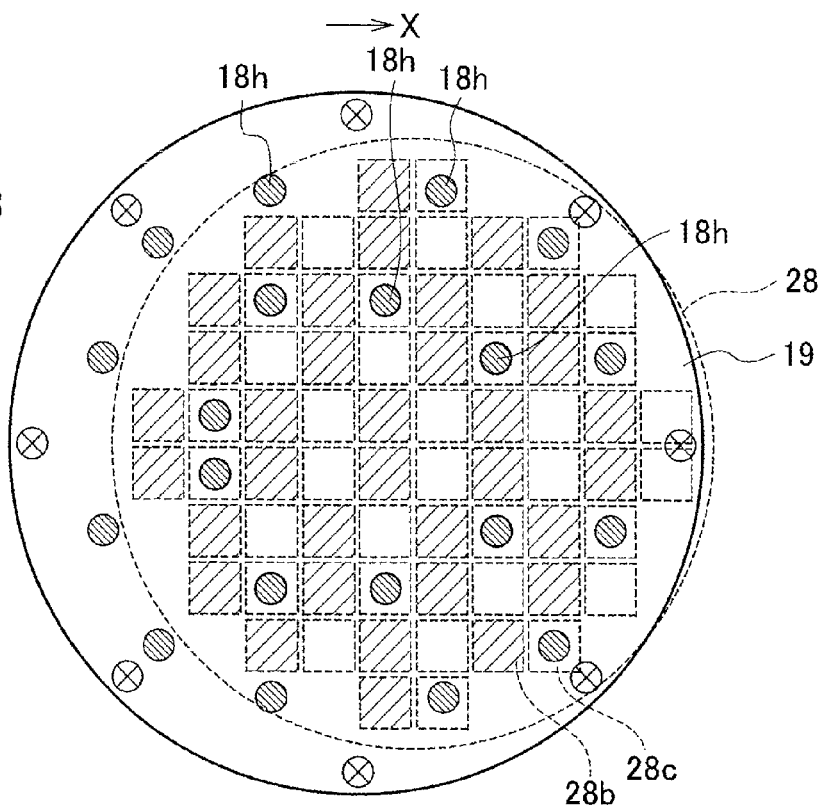

FIGS. 10A and 10B are views of the probe board 18 included in the electric connecting apparatus 1 according to the fourth embodiment seen from a lower side. FIG. 10A illustrates first abutment while FIG. 10B illustrates second abutment. Note that, in FIGS. 10A and 10B, a position of the semiconductor wafer 28 and positions of the connection pads 28a of the multiple chips or DUT chips formed on the semiconductor wafer 28 are illustrated by dashed lines.

The number of the probes 18a of the probe board 18 included in the electric connecting apparatus 1 according to the fourth embodiment is half of the number of the probes 18a of the probe board 18 included in the electric connecting apparatus 1 according to the first embodiment.

Thus, the number of the probes 18a of the probe board 18 included in the electric connecting apparatus 1 according to the fourth embodiment is half of the number of the probes 18a of the probe board 18 included in the electric connecting apparatus 1 according to the first embodiment. After the probes 18a abut on the first half of the respective corresponding connection pads 28a to perform an electric test, the chuck top 21 is moved, and the probes 18a abut on the other half of the connection pads 28a to perform an electric test.

Specifically, as illustrated in FIG. 10A, as first abutment, the electric connecting apparatus 1 according to the fourth embodiment performs an electric test of the connection pads 28a located at positions 28c of the connection pads in first abutment illustrated as hatched rectangles drawn by dashed lines out of all the connection pads 28a respectively corresponding to the probes 18a.

The electric connecting apparatus 1 according to the fourth embodiment thereafter moves the chuck top 21 in an X direction.

By doing so, as illustrated in FIG. 10B, as second abutment, the electric connecting apparatus 1 performs an electric test of the connection pads 28a located at positions 28b of the connection pads in second abutment illustrated as hatched rectangles drawn by dashed lines out of all the connection pads 28a respectively corresponding to the probes 18a.

In this manner, in the electric connecting apparatus 1 according to the fourth embodiment, since the number of the probes 18a is half, wiring can be simplified.

Also, since the number of the probes 18a is half, the elastic heat conducting members 18h can be arranged not only outside the positions of the connection pads 28a but also inside the positions of the connection pads 28a, that is, at positions not provided with the probes 18a as illustrated in FIGS. 10A and 10B.

By doing so, heat is transferred from the semiconductor wafer 28 to the probe board 18 more easily. Accordingly, time until the probe board 18 reaches heat equilibrium can be further shortened, and time until start of measurement can be drastically shortened.

What is claimed is:

1. An electric connecting apparatus having a working table holding on a working surface thereof a device under test having a plurality of electrodes and heating or cooling the device under test and electrically connecting the plurality of electrodes to a tester, comprising:
    a probe card having a probe board provided with a first surface thereof opposed to the tester and having formed therein a conductive path to be electrically connected to the tester and a plurality of probes provided on a second surface of the probe board to be connected to the conductive path so as to enable to respectively contact the plurality of electrodes of the device under test on the working table and moving relatively to the working table; and
    one or a plurality of elastic heat conducting member(s) arranged between the working surface of the working table or the device under test on the working surface and the probe board,
    wherein the elastic heat conducting member enables to abut on and conduct heat to the working surface of the working table or the device under test on the working surface and the probe board in a state in which the plurality of probes do not abut on the plurality of respective corresponding electrodes and is elastically deformable not to prevent abutment between the plurality of probes and the plurality of respective corresponding electrodes.

2. The electric connecting apparatus according to claim 1, wherein, in a free state of not receiving elastic compression between the working surface of the working table or the device under test on the working surface and the probe board, the elastic heat conducting member has a longer dimension than a distance from the probe board to tip ends of the probes.

3. The electric connecting apparatus according to claim 2, wherein the elastic heat conducting member is fixed at a first end thereof on the second surface of the probe board and projects at a second end thereof toward the device under test, going over the tip ends of the probe.

4. The electric connecting apparatus according to claim 1, wherein the elastic heat conducting member is made of heat conductive silicon rubber.

5. The electric connecting apparatus according to claim 4, wherein the elastic heat conducting members are a plurality of columnar bodies arranged to surround an arranging region of the probes of the probe board.

6. The electric connecting apparatus according to claim 4, wherein the elastic heat conducting member is an annular member arranged to surround the arranging region of the probes of the probe board.

7. An electric connecting apparatus having a working table holding on a working surface thereof a device under test having a plurality of electrodes and heating or cooling the device under test and electrically connecting the plurality of electrodes to a tester, comprising:
    a probe card having a probe board provided with a first surface thereof opposed to the tester and having formed therein a conductive path to be electrically connected to the tester and a plurality of probes provided on a second surface of the probe board to be connected to the conductive path so as to enable to respectively contact the plurality of electrodes of the device under test on the working table and moving relatively to the working table; and
    one or a plurality of elastic heat conducting member(s) arranged between the working surface of the working table or the device under test on the working surface and the probe board;
    wherein the elastic heat conducting member enables to abut on the working surface of the working table or the device under test on the working surface and the probe board in a state in which the plurality of probes do not abut on the plurality of respective corresponding electrodes and is elastically deformable not to prevent abutment between the plurality of probes and the plurality of respective corresponding electrodes; and
    wherein, in a free state of not receiving elastic compression between the working surface of the working table or the device under test on the working surface and the probe board, the elastic heat conducting member has a longer dimension than a distance from the probe board to tip ends of the probes.

* * * * *